United States Patent
James et al.

(10) Patent No.: US 12,123,919 B2
(45) Date of Patent: Oct. 22, 2024

(54) BATTERY MOCK-UP SAMPLES INCLUDING LITHIUM METAL OR LITHIUM MIMIC METAL FOR ELECTROMAGNETIC TESTING IN AMBIENT CONDITIONS

(71) Applicant: GM GLOBAL TECHNOLOGY OPERATIONS LLC, Detroit, MI (US)

(72) Inventors: Robin James, Rochester Hills, MI (US); Megan E. McGovern, Detroit, MI (US); Dmitriy Bruder, Clinton Township, MI (US); Whitney Ann Poling, Rochester Hills, MI (US); Erik Damon Huemiller, Troy, MI (US); Shaomao Xu, Sterling Heights, MI (US); Caleb Reese, Ferndale, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 135 days.

(21) Appl. No.: 17/971,774

(22) Filed: Oct. 24, 2022

(65) Prior Publication Data

US 2024/0133962 A1 Apr. 25, 2024
US 2024/0230773 A9 Jul. 11, 2024

(51) Int. Cl.
*G01R 31/30* (2006.01)
*G01R 31/385* (2019.01)
*H01M 10/0525* (2010.01)

(52) U.S. Cl.
CPC .... *G01R 31/3865* (2019.01); *H01M 10/0525* (2013.01)

(58) Field of Classification Search
None
See application file for complete search history.

(56) References Cited

U.S. PATENT DOCUMENTS

| | | | | |
|---|---|---|---|---|
| 2006/0109003 A1* | 5/2006 | Redko | ........... | G01N 27/9026 324/240 |
| 2007/0037058 A1* | 2/2007 | Visco | ........... | H01M 4/134 429/185 |
| 2010/0221607 A1* | 9/2010 | Hatanaka | ........... | H01M 4/62 429/209 |
| 2019/0257794 A1 | 8/2019 | McGovern et al. | | |

OTHER PUBLICATIONS

U.S. Appl. No. 17/350,620, filed Jun. 17, 2021, Salvador et al.
U.S. Appl. No. 17/350,644, filed Jun. 17, 2021, Bruder et al.
U.S. Appl. No. 17/350,650, filed Jun. 17, 2021, Ardanese et al.
U.S. Appl. No. 17/490,519, filed Sep. 30, 2021, Huemiller et al.
U.S. Appl. No. 17/530,743, filed Nov. 19, 2021, Huemiller et al.
U.S. Appl. No. 17/539,421, filed Dec. 1, 2021, Xu et al.
U.S. Appl. No. 17/543,864, filed Dec. 7, 2021, Ardanese et al.
U.S. Appl. No. 17/555,841, filed Dec. 20, 2021, Huemiller et al.
U.S. Appl. No. 17/576,176, filed Jan. 14, 2022, Zhao et al.
U.S. Appl. No. 17/743,862, filed May 13, 2022, Zeng et al.
U.S. Appl. No. 17/972,063, filed Oct. 24, 2022, James et al.

* cited by examiner

*Primary Examiner* — Jas A Sanghera

(57) ABSTRACT

A method for validating non-destructive, electromagnetic methods in atmospheric conditions of a battery cell intended to include a lithium metal layer includes selecting a lithium mimic metal layer to replace the lithium metal layer; and creating a mock-up sample including one or more layers of the battery cell. One or more layers comprise the lithium mimic metal layer. The method includes performing electromagnetic testing of the mock-up sample.

20 Claims, 4 Drawing Sheets

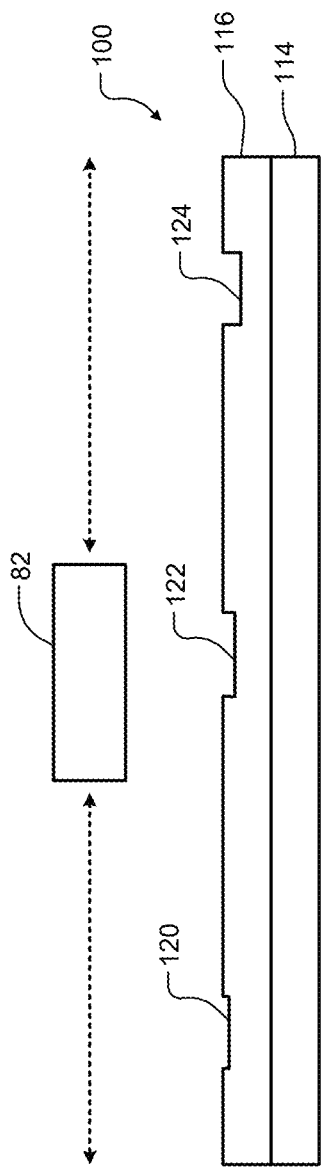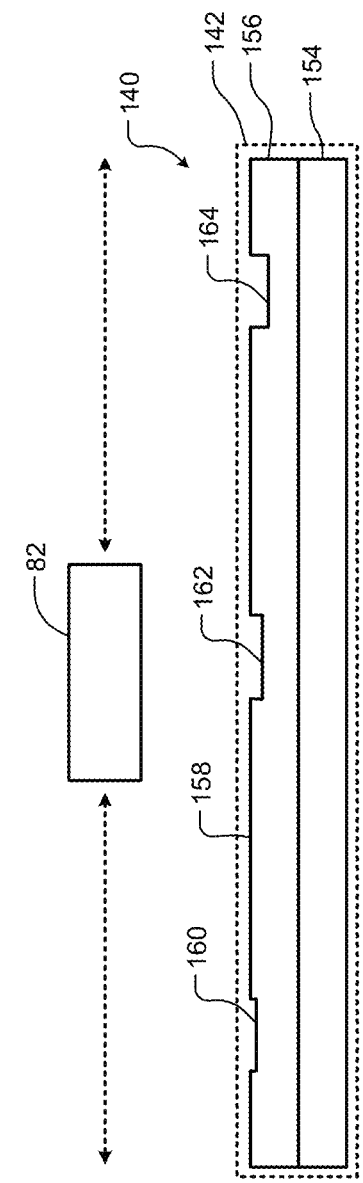

BATTERY MOCK-UP SAMPLES INCLUDING LITHIUM METAL OR LITHIUM MIMIC METAL FOR ELECTROMAGNETIC TESTING IN AMBIENT CONDITIONS

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to testing of battery cells including lithium metal, and more particularly to methods for using lithium metal battery mock-up samples for evaluating electromagnetic testing technologies in ambient conditions.

Electric vehicles (EVs) such as battery electric vehicles (BEVs), hybrid vehicles, and/or fuel cell vehicles include one or more electric machines and a battery system including one or more battery cells, modules and/or packs. A power control system is used to control charging and/or discharging of the battery system during charging and/or driving. Manufacturers of EVs are pursuing increased power density to increase the range of the EVs. Lithium-ion battery (LIB) cells are currently used for high power density applications.

SUMMARY

A method for validating non-destructive, electromagnetic methods in atmospheric conditions of a battery cell intended to include a lithium metal layer includes selecting a lithium mimic metal layer to replace the lithium metal layer; and creating a mock-up sample including one or more layers of the battery cell. The one or more layers of the battery cell comprise the lithium mimic metal layer. The method includes performing an electromagnetic test of the mock-up sample.

In other features, the lithium mimic metal layer includes a metal selected from a group consisting of indium (In), tin (Sb), iron (Fe), chromium (Cr), nickel (Ni), and alloys thereof. The lithium mimic metal layer comprises a non-reactive metal. The lithium mimic metal layer comprises a metal having a conductivity within +/−30% of the lithium metal layer.

In other features, one or more layers of the battery cell comprise a first current collector and a first active material layer arranged on one side of the first current collector. The first active material layer includes the lithium mimic metal layer.

In other features, the electromagnetic test comprises sensing an electromagnetic parameter of the mock-up sample using an eddy current probe. The lithium mimic metal layer includes a first region having a first thickness and a second region having a second thickness that is greater than the first thickness.

In other features, the one or more layers of the battery cell comprise a first current collector and a first active material layer. The lithium mimic metal layer is sandwiched between the first current collector and the first active material layer.

In other features, a second active material layer is arranged adjacent to the first current collector. A separator is arranged adjacent to the first active material layer. A third active material layer is arranged adjacent to the separator. A fourth active material layer is arranged adjacent to the second current collector.

In other features, the method includes arranging the mock-up sample adjacent to one or more mesh layers. The method includes arranging the mock-up sample adjacent to one or more expanded foil layers. The lithium mimic metal layer is formed on at least one of the one or more layers of the battery cell using additive manufacturing. The lithium mimic metal layer is one of coated or painted on at least one of the one or more layers of the battery cell. The lithium mimic metal layer comprises one of a powder and shavings arranged on at least one of the one or more layers of the battery cell. The lithium mimic metal layer is laminated on at least one of the one or more layers of the battery cell.

A method for performing non-destructive, electromagnetic testing of a battery cell including a lithium metal layer includes creating a mock-up sample of a portion of the battery cell and including a layer of the battery cell, wherein the layer comprises the lithium metal layer; enclosing the mock-up sample in a sealing membrane; and performing an electromagnetic test on the mock-up sample.

In other features, the sealing membrane comprises a polymer film. The electromagnetic testing comprises sensing an electromagnetic parameter of the mock-up sample using an eddy current probe. The lithium metal layer includes a first region having a first thickness and a second region having a second thickness that is greater than the first thickness.

In other features, the one or more layers of the battery cell further comprise a first current collector and a first active material layer. At least one of: the lithium metal layer is sandwiched between the first current collector and the first active material layer; and the first active material layer comprises the lithium metal layer.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3 is a side cross-sectional view of an example of a mock-up sample including a lithium metal mimic material according to the present disclosure;

FIG. 4 is a side cross-sectional view of an example of a mock-up sample enclosed in a sealing membrane and including a lithium metal mimic material according to the present disclosure;

In the drawings, reference numbers may be reused to identify similar and/or identical elements.

DETAILED DESCRIPTION

Figure 1A:
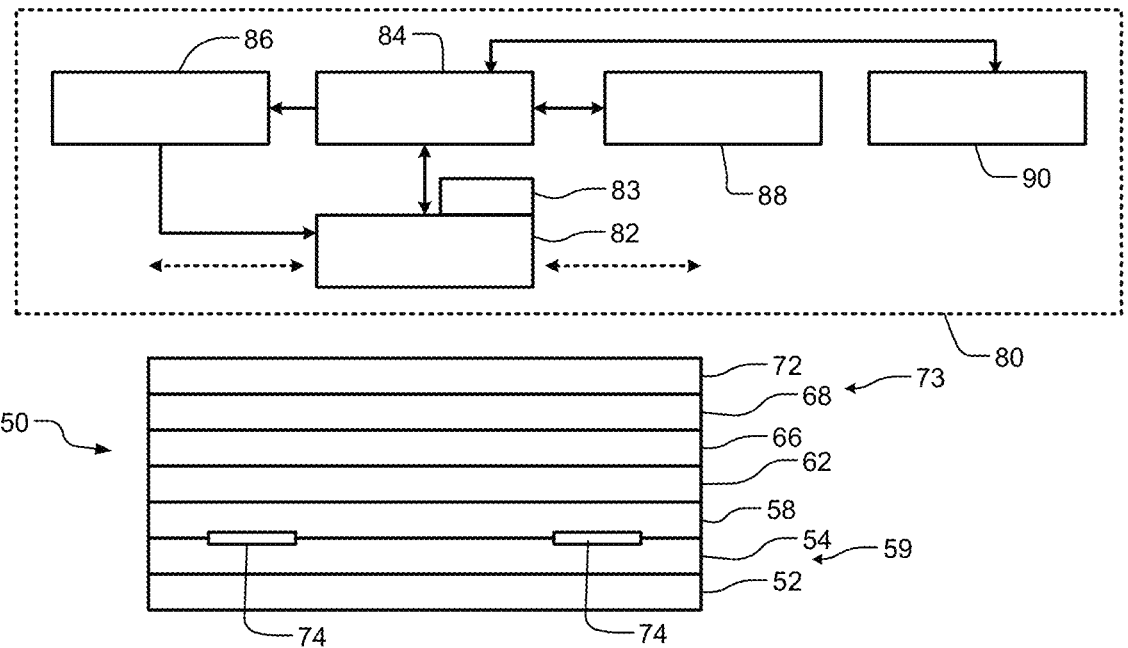
FIG. 1A is a functional block diagram of an example of a testing system and cross-sectional view of an example of a mock-up sample of a portion of a battery cell including a lithium metal mimic material according to the present disclosure.

Lithium battery cells are currently used in applications such as EVs requiring high power density. Some of the battery cells may include lithium metal anodes. After manufacturing a product such as battery cells, testing is usually performed to ensure that the product is manufactured correctly. The manufacturer or a third party develops nondestructive tests to validate various characteristics of the product or to detect defects. That way, some or all of the products are tested after manufacture and prior to sale to improve quality and/or to ensure consistent performance.

When developing testing for a product, a manufacturer may create mock-up samples using the same materials as the production product. However, the battery cells include lithium metal which is unstable and reactive in atmospheric conditions. When exposed to air, the lithium metal reacts with water vapor (e.g., humidity). The lithium metal forms strong base-lithium hydroxide and hydrogen gas which can potentially be exothermic. As used herein, reactive refers to reactivity in ambient conditions at atmospheric pressure and/or with water vapor or humidity present. Therefore, it difficult to determine the effectiveness of various electromagnetic testing technologies on the battery cells since battery mock-up samples including lithium metal are not stable outside of a glovebox/dry room and cannot be sent directly to testing companies for development purposes.

The present disclosure relates to battery mock-up samples including a portion (e.g., one or more layers) of a battery cell and at least one of the one or more layers includes a non-reactive lithium mimic metal layer representing the lithium metal layer. For example, the lithium metal mimic layer may replace lithium metal anodes and/or some or all of an active material layer.

The battery mock-up samples can be handled in atmospheric conditions outside of a glovebox. The lithium metal battery mock-up samples may be used to evaluate distinct types of nondestructive electromagnetic testing technologies and their respective abilities to identify characteristics and/or defects of the lithium metal layer.

The battery mock-up samples can be used to represent a defective lithium metal layer by mimicking the effects of defects that occur during the manufacturing process (contamination, thickness variation, and/or other non-uniformity) and/or during the operation of a battery cell (such as lithium plating). The battery mock-up samples according to the present disclosure enable testing and validation of possible failure modes that can occur during production of lithium metal anodes and battery cells including of lithium metal anodes or after usage.

In some examples, the battery mock-up samples are used to mimic characteristics of the lithium metal such as thickness, thickness uniformity, defects such as cracks, and/or other characteristics. For example, these types of characteristics are important to monitor when using high volume roll-to-roll production processes. In other examples, the battery mock-up samples are used to detect lithium metal that is contaminated with foreign debris. In yet other examples, the battery mock-up samples are used to detect characteristics of lithium plating in battery cells that occur after working the battery cell.

The battery mock-up samples should mimic the electromagnetic behavior of the lithium-containing samples and can be manufactured in a variety of different ways. In some examples, the battery mock-up samples are created by additively manufacturing (e.g., 3D printing) a lithium metal mimic layer on a substrate (e.g., copper (Cu). In other examples, the battery mock-up samples are created by depositing lithium metal mimic powder or shavings on a substrate such as Cu foil or tape. In other examples, the battery mock-up samples are created by laminating lithium metal mimic foil on a substrate such as Cu foil.

In other examples, the battery mock-up samples are created by sputter coating or spray coating a lithium metal mimic layer on a substrate such as Cu foil. In other examples, the battery mock-up samples are created by applying a conductive paint layer on a substrate such as Cu foil. In other examples, the battery mock-up samples are created by sputter coating a lithium metal mimic on a substrate.

In some examples, the lithium metal mimic has approximately the same electrical conductivity (or a difference in electrical conductivity relative to another layer), density, thermal conductivity, mechanical properties, homologous temperature, and/or crystalline structure as lithium metal. As used herein, approximately means within +/−10%, 20% or 30%. In some examples, the lithium metal mimic has approximately the same difference in electrical conductivity as a difference in electrical conductivity between a lithium metal layer and another layer (such as copper or another material). As used herein, approximately means within +/−10%, 20% or 30%.

In some examples, the battery mock-up samples include one or more layers of a battery cell (where at least one layer is made of lithium metal rather than a lithium mimic metal) that are vacuum sealed inside a non-conductive pouch material to allow handling in atmospheric conditions. In some examples, the battery mock-up samples are manufactured with the same process that is used to manufacture the lithium metal.

Figure 1B:
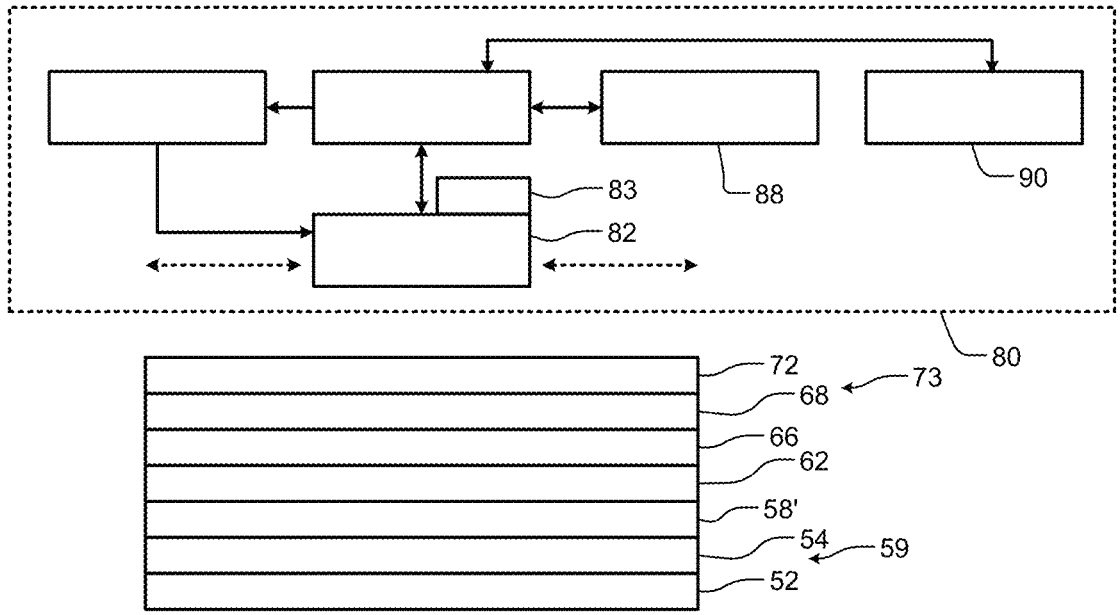
FIG. 1B is a functional block diagram of an example of a testing system and cross-sectional view of an example of a mock-up sample of a portion of a battery cell including a lithium metal mimic material according to the present disclosure.
Figure 2:
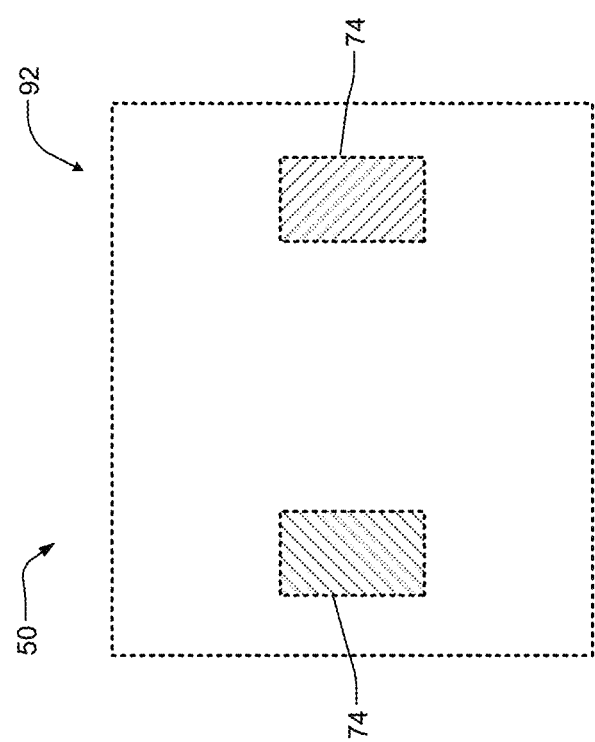
FIG. 2 is a plan view of an example of an image of the mock-up sample of FIG. 1A generated during electromagnetic testing according to the present disclosure.

Referring now to FIGS. 1A to 2, examples of battery mock-up samples are shown. In FIG. 1A, a battery mock-up sample 50 is shown to include an active material layer 52. A current collector 54 is arranged adjacent to the active material layer 52. An active material layer 58 is arranged adjacent to the current collector 54. In some examples, the active material layer 52, the current collector 54, and the active material layer 58 may correspond to an anode electrode 59.

A separator 62 is arranged adjacent to the active material layer 58. An active material layer 66 is arranged adjacent to the separator 62. A current collector 68 is arranged adjacent to the active material layer 66. The active material layer 66 and the current collector 68 may correspond to a cathode electrode. An active material layer 72 is arranged adjacent to the current collector 68. In some examples, the active material layer 66, the current collector 68 and the active material layer correspond to a cathode electrode 73. In some examples, the active material layers are configured to exchange lithium ions.

One or more lithium metal mimic layers 74 is arranged between the active material layer 58 and the current collector 54 of the anode electrode 59. The lithium metal mimic layer 74, the active material layer 58, and the current collector 54 may correspond to an anode electrode.

In FIG. 1B, an active material layer 58 is replaced by a lithium-based active material mimic layer 58' (and the one or more lithium metal mimic layers 74 in FIG. 1A are omitted).

In FIGS. 1A and 1B, a testing device 80 is used to sense properties of the lithium metal mimic layer 74. For example, the testing device 80 may include an eddy current probe 82, a power supply 86, a controller 84, a display 88, and an input device 90 such as a keyboard, mouse, touchpad, or other device. The controller 84 is configured to cause the power supply 86 to supply current to the eddy current probe 82. A position encoder 83 may be used to identify a position of the eddy current probe 82 relative to the battery mock-up sample 50. In some examples, the position encoder 83 includes one or more encoder wheels.

As can be appreciated, eddy current testing can be used to detect a lithium metal mimic layer such as tape (with similar electromagnetic properties (e.g., conductivity) as that of lithium metal) sandwiched between layers of a dry representative battery cell. The eddy current testing can be performed without requiring voltage to be supplied to the battery mock-up sample 50. This testing approach can be used to replicate lithium plating. Furthermore, the testing can be performed in atmospheric conditions outside of a glovebox.

In FIG. 2, the controller 84 receives an output signal of the eddy current probe 82 and generates an image 92 of the battery mock-up sample 50. In some examples, the controller 84 is configured to display the battery mock-up sample 50 with different colors, patterns, numerical labels, or other indicia relating to characteristics of the battery mock-up samples. For example, the controller 84 generates the image 92 showing the relative positions of the lithium metal mimic layer 74 relative to the battery mock-up sample 50 and the thickness of the lithium metal mimic layer 74 using different patterns, colors, text, or other indicia.

Referring now to FIG. 3, a mock-up sample 100 includes a first layer 114 such as copper foil and a second layer 116 made of a mimic material and including portions 118, 120, 122, and 124 having two or more different thicknesses.

In FIG. 4, a battery mock-up sample 140 includes a first layer 154 such as copper foil and a second layer 156 made of a lithium metal and including portions 158, 160, 162, and 164 having different thicknesses. A sealing membrane 142 surrounds the battery mock-up sample 140. In some examples, the sealing membrane 142 provides a vacuum seal and is made of a material that is electrically non-conductive. In some examples, the sealing membrane 142 is made of a polymer film such as polyester, Mylar® or another suitable material.

Figure 5:
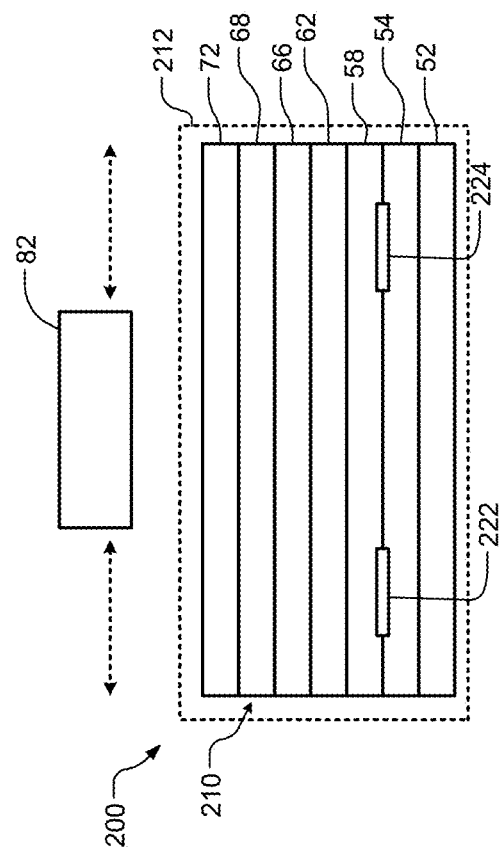
FIG. 5 is a side cross sectional view of an example of a mock-up sample enclosed in a sealing membrane and including a lithium metal mimic material according to the present disclosure.

Referring now to FIG. 5, a battery mock-up sample 200 includes a battery cell 210 that is similar to the mimic battery cell in FIG. 1 except that lithium metal layers 222 and 224 are used (and not lithium metal mimic layers). The lithium metal layers 222 and 224 are arranged between the active material layer 58 and the current collector 54. A sealing membrane 212 encloses the battery cell 210. In some examples, the sealing membrane 212 is made of a non-conducting material and provides a vacuum seal. In some examples, the sealing membrane 212 is made of a polymer film such as polyester, Mylar® or another suitable material.

Figure 6:
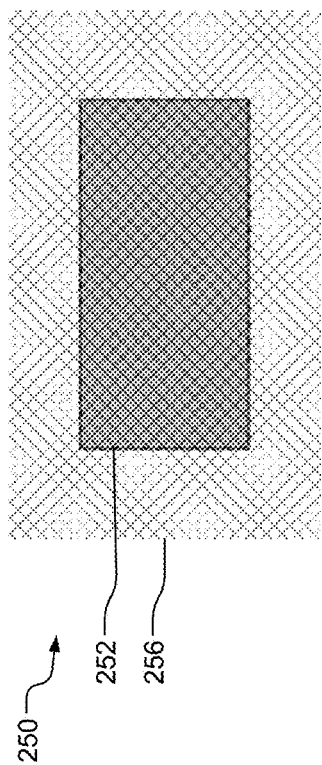
FIG. 6 is a plan view of an example of a mock-up sample including a lithium metal mimic material arranged adjacent to one or more mesh layers according to the present disclosure.

Referring now to FIG. 6, a battery mock-up sample 250 (such as those described herein and including a lithium metal mimic layer 252) adjacent to a mesh layer 256 (or between mesh layers 256). The mesh layer 256 allows safe handling of the battery mock-up sample 250. In some examples, the mesh layer 256 comprises a metallic material. In some examples, the mesh layer 256 is made of copper (Cu) and the lithium metal mimic layer 252 includes a metal selected from a group consisting of indium (In), tin (Sb), iron (Fe), chromium (Cr), nickel (Ni), and alloys thereof.

Figure 7:
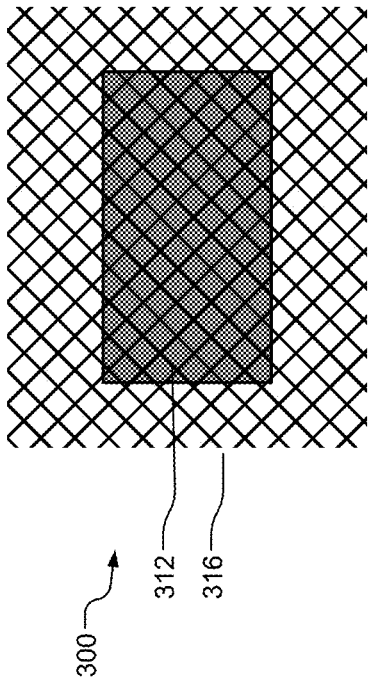
FIG. 7 is a plan view of an example of a mock-up sample including a lithium metal mimic material arranged adjacent to one or more expanded foil layers according to the present disclosure.

Referring now to FIG. 7, a battery mock-up sample 300 (such as those described herein and including a lithium metal mimic layer 312) adjacent to an expanded metal foil layer 316 (or between expanded metal foil layers 316). The expanded metal foil layer 316 allows safe handling of the battery mock-up sample 300. In some examples, the expanded metal foil layer 316 is made of copper (Cu) and the lithium metal mimic layer 312 includes a metal selected from a group consisting of indium (In), tin (Sb), iron (Fe), chromium (Cr), nickel (Ni), and alloys thereof The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A method for validating non-destructive, electromagnetic test methods in atmospheric conditions for a battery cell intended to include a lithium metal layer, comprising:
    selecting a lithium mimic metal layer to replace the lithium metal layer;
    creating a mock-up sample including one or more layers of the battery cell,
    wherein one or more layers of the battery cell comprise the lithium mimic metal layer; and
    performing an electromagnetic test of the mock-up sample.

2. The method of claim 1, wherein the lithium mimic metal layer includes a metal selected from a group consisting of indium (In), tin (Sb), iron (Fe), chromium (Cr), nickel (Ni), and alloys thereof.

3. The method of claim 1, wherein the lithium mimic metal layer comprises a non-reactive metal.

4. The method of claim 1, wherein the lithium mimic metal layer comprises a metal having a conductivity within +/−30% of the lithium metal layer.

5. The method of claim 1, wherein the one or more layers of the battery cell comprise:
    a first current collector; and
    a first active material layer arranged on one side of the first current collector,
    wherein the first active material layer includes the lithium mimic metal layer.

6. The method of claim 1, wherein performing the electromagnetic test comprises sensing an electromagnetic parameter of the mock-up sample using an eddy current probe.

7. The method of claim 1, wherein the lithium mimic metal layer includes a first region having a first thickness and a second region having a second thickness that is greater than the first thickness.

8. The method of claim 1, wherein the one or more layers of the battery cell comprise:
    a first current collector; and a first active material layer,
wherein the lithium mimic metal layer is sandwiched between the first current collector and the first active material layer.

9. The method of claim 8, further comprising:
a second active material layer arranged adjacent to the first current collector;
a separator arranged adjacent to the first active material layer;
a third active material layer arranged adjacent to the separator;
a second current collector; and
a fourth active material layer arranged adjacent to the second current collector.

10. The method of claim 1, further comprising arranging the mock-up sample adjacent to one or more mesh layers.

11. The method of claim 1, further comprising arranging the mock-up sample adjacent to one or more expanded foil layers.

12. The method of claim 1, wherein the lithium mimic metal layer is formed on at least one of the one or more layers of the battery cell using additive manufacturing.

13. The method of claim 1, wherein the lithium mimic metal layer is one of coated or painted on at least one of the one or more layers of the battery cell.

14. The method of claim 1, wherein the lithium mimic metal layer comprises one of a powder and shavings arranged on at least one of the one or more layers of the battery cell.

15. The method of claim 1, wherein the lithium mimic metal layer is laminated on at least one of the one or more layers of the battery cell.

16. A method for performing non-destructive, electromagnetic testing of a battery cell including a lithium metal layer, comprising:
selecting a lithium-based mimic metal layer to replace the lithium metal layer;
creating a mock-up sample of a portion of the battery cell, the mock-up sample including a layer of the battery cell, wherein the layer comprises the lithium-based mimic metal layer;
enclosing the mock-up sample in a sealing membrane; and
performing an electromagnetic test of the mock-up sample.

17. The method of claim 16, wherein the sealing membrane comprises a polymer film.

18. The method of claim 16, wherein performing the electromagnetic test comprises sensing an electromagnetic parameter of the mock-up sample using an eddy current probe.

19. The method of claim 16, wherein the lithium-based mimic metal layer includes a first region having a first thickness and a second region having a second thickness that is greater than the first thickness.

20. The method of claim 16, wherein the battery cell further comprises:
a current collector; and
an active material layer,
wherein the lithium-based mimic metal layer is between the current collector and the active material layer.

* * * * *